United States Patent
Kang et al.

(10) Patent No.: US 9,490,030 B2
(45) Date of Patent: Nov. 8, 2016

(54) CIRCUIT FOR CONTROLLING WRITE LEVELING OF A TARGET MODULE AND A METHOD THEREOF

(71) Applicant: SAMSUNG ELECTRONICS CO., LTD., Suwon-Si, Gyeonggi-Do (KR)

(72) Inventors: Hyun-Joon Kang, Hwaseong-si (KR); Yongchun Kim, Yongin-si (KR); Sungkook Shin, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 145 days.

(21) Appl. No.: 14/573,379

(22) Filed: Dec. 17, 2014

(65) Prior Publication Data

US 2015/0206560 A1 Jul. 23, 2015

(30) Foreign Application Priority Data

Jan. 23, 2014 (KR) .................. 10-2014-0008479

(51) Int. Cl.
| | | |
|---|---|---|
| G06F 12/00 | (2006.01) | |
| G11C 29/02 | (2006.01) | |
| G11C 7/10 | (2006.01) | |
| G11C 7/22 | (2006.01) | |

(52) U.S. Cl.
CPC .......... *G11C 29/023* (2013.01); *G11C 7/1066* (2013.01); *G11C 7/1069* (2013.01); *G11C 7/222* (2013.01); *G11C 29/022* (2013.01); *G11C 29/028* (2013.01)

(58) Field of Classification Search
CPC . G11C 29/023; G11C 7/1066; G11C 7/1069; G11C 7/222; G11C 29/022; G11C 29/028
See application file for complete search history.

(56) References Cited

U.S. PATENT DOCUMENTS

| | | | |
|---|---|---|---|
| 7,796,465 B2 | 9/2010 | Swain et al. | |
| 7,839,716 B2 | 11/2010 | Kong et al. | |
| 7,859,879 B2 | 12/2010 | Park et al. | |
| 7,952,945 B2 | 5/2011 | Espinoza et al. | |
| 7,961,533 B2 | 6/2011 | Searles | |
| 8,020,022 B2 | 9/2011 | Tokuhiro | |
| 8,122,275 B2 | 2/2012 | Chong et al. | |
| 8,238,175 B2 | 8/2012 | Fujisawa | |
| 8,243,534 B2 | 8/2012 | Fujisawa | |
| 8,386,737 B2 | 2/2013 | Jeon et al. | |
| 2004/0158688 A1* | 8/2004 | Rentschler | G06F 13/1689 711/167 |
| 2005/0188281 A1* | 8/2005 | Nguyen | G11C 29/02 714/42 |
| 2013/0007399 A1* | 1/2013 | Smith | G06F 1/08 711/167 |
| 2013/0141994 A1 | 6/2013 | Ito et al. | |

FOREIGN PATENT DOCUMENTS

JP 2013-054692 3/2013

* cited by examiner

*Primary Examiner* — John A Lane
(74) *Attorney, Agent, or Firm* — F. Chau & Associates, LLC

(57) ABSTRACT

A write leveling control method which includes registering data-related signal (DRS) reference delay values corresponding to types of memory modules in a leveling reference table; transmitting write leveling-related signals to a first type of memory module mounted on a target board; detecting timing skews between a clock signal and data-related signals received from memory devices on the mounted memory module; and adjusting a delay of a data-related signal transmitted to a memory device of the mounted memory module if a corresponding timing skew is outside of a first range, based on the DRS reference delay value corresponding to the mounted memory module.

20 Claims, 17 Drawing Sheets

CIRCUIT FOR CONTROLLING WRITE LEVELING OF A TARGET MODULE AND A METHOD THEREOF

CROSS-REFERENCE TO RELATED APPLICATION

This application claims priority under 35 U.S.C. §119 to Korean Patent Application No. 10-2014-0008479 filed Jan. 23, 2014, in the Korean Intellectual Property Office, the disclosure of which is incorporated by reference herein in its entirety.

TECHNICAL FIELD

The inventive concept described herein relates to a technique of controlling write leveling of a target module.

DISCUSSION OF THE RELATED ART

As electronic devices become more highly integrated, high-speed, low-power, and highly integrated semiconductor memory devices may be required. To accomplish this, a multilayered device which is small in size and which has transistor cells arranged in a vertical/horizontal direction has been developed.

As semiconductor memory devices are scaled down and increase in speed, timing when signals for accessing data are exchanged may be an issue. In particular, in a memory system, timing margins of a command/address, a clock signal, and a data strobe signal may become very tight according to an increase in a frequency of the clock signal. For example, in a memory system including a memory controller and a memory module, signal lines on memory devices in a memory module may be different from one another, such that signals transferred to different memory devices in the memory module may have different timings.

In the memory system, in particular, during a write operation in which data is written to a memory device, a write leveling operation is performed to ensure that a clock signal and a data strobe signal reach each memory device of the memory module within a certain timing window.

Here, the memory controller delays the data strobe signal such that the data strobe signal and the clock signal reach a memory device at the same time.

However, as an operating frequency increases, the ability to adjust signal timing using the write leveling operation is curtailed.

In a double data rate type three (DDR3) dual in-line memory module (DIMM), for example, its structural characteristic results in a timing skew between a clock signal and a data strobe signal (CK-DQS). To stabilize a write operation due to this timing skew, a calibration operation, in other words, a write leveling operation is performed upon power-on of a memory system or periodically.

However, there is likelihood that the calibration operation may fail due to a Process, Voltage, Temperature (PVT) variation.

SUMMARY

An exemplary embodiment of the inventive concept provides a write leveling control method which includes registering data-related signal (DRS) reference delay values corresponding to types of memory modules in a leveling reference table; transmitting write leveling-related signals to a first type of memory module mounted on a target board; detecting timing skews between a clock signal and data-related signals received from memory devices on the mounted memory module; and adjusting a delay of a data-related signal transmitted to a memory device of the mounted memory module if a corresponding timing skew is outside of a first range, based on the DRS reference delay value corresponding to the mounted memory module.

In an exemplary embodiment of the inventive concept, the data-related signals comprise a data strobe signal indicating validity of an associated data signal.

In an exemplary embodiment of the inventive concept, the memory devices include a double data rate type three (DDR3) synchronous dynamic random access memory (SDRAM).

In an exemplary embodiment of the inventive concept, the mounted memory module includes an unbuffered dual in-line memory module (UDIMM), a very low profile dual in-line memory module (VLPDIMM), a registered dual in-line memory module (RDIMM), or a small outline dual in-line memory module (SODIMM).

In an exemplary embodiment of the inventive concept, the DRS reference delay values are differentiated according to a topology of the target board.

In an exemplary embodiment of the inventive concept, when a timing skew exceeds more than 25% of the DRS reference delay value corresponding to the mounted memory module, the delay of the data-related signal transmitted to the memory device corresponding to the timing skew outside of the first range is adjusted by referring to that DRS reference delay value.

In an exemplary embodiment of the inventive concept, the delay of the data-related signal transmitted to the memory device corresponding to the timing skew outside of the first range is adjusted by using an average offset value of memory devices that passed a write leveling operation.

An exemplary embodiment of the inventive concept provides a write leveling control method which includes storing data strobe signal (DQS) reference delay values corresponding to types of dual in-line memory modules in a reference memory as serial presence detect (SPD) information; identifying a type of dual in-line memory module mounted on a target board using the SPD information and providing the mounted dual in-line memory module with write leveling-related signals including a clock signal, a command, an address, and a data strobe signal; detecting timing skews between the clock signal and data strobe signals received from memory devices on the mounted dual in-line memory module; and adjusting a timing of a data strobe signal transmitted to the memory device corresponding to a timing skew outside of a first range based on an average offset value of memory devices that passed a write leveling operation and the DQS reference delay value corresponding to the mounted dual in-line memory module.

In an exemplary embodiment of the inventive concept, the reference memory includes a nonvolatile semiconductor memory.

In an exemplary embodiment of the inventive concept, the dual in-line memory module includes a buffer chip when the memory devices include a DDR3 SDRAM.

In an exemplary embodiment of the inventive concept, the dual in-line memory module includes a DDR3 dual in-line memory module (DIMM).

In an exemplary embodiment of the inventive concept, the DQS reference delay values are differentiated according to a topology of the target board.

In an exemplary embodiment of the inventive concept, the first range is within about 25% of the DQS reference delay value corresponding to the mounted dual in-line memory module.

In an exemplary embodiment of the inventive concept, the DQS reference delay values are differentiated according to a system-on chip.

An exemplary embodiment of the inventive concept provides a write leveling control circuit which comprises a leveling reference table configured to store DRS reference delay values corresponding to types of memory modules; and a write leveling management circuit configured to transmit write leveling-related signals to a memory module mounted on a target board, wherein the write leveling management circuit checks timing skews between a clock signal and data-related signals received from memory devices on the mounted memory module, wherein when a skew failure occurs, the write leveling management circuit adjusts a timing of a data-related signal sent to a memory device experiencing the skew failure, based on the DRS reference delay value corresponding to the mounted memory module.

In an exemplary embodiment of the inventive concept, the leveling reference table includes a nonvolatile semiconductor memory.

In an exemplary embodiment of the inventive concept, the data-related signal includes a data strobe signal indicating validity of a data signal.

In an exemplary embodiment of the inventive concept, the write leveling-related signals include a clock signal, a command, an address, and the data strobe signal.

In an exemplary embodiment of the inventive concept, the write leveling management circuit comprises a clock generator configured to generate the clock signal; a data strobe signal generator configured to generate the data strobe signal with a delay that is adjusted according to a control signal; and a control unit configured to provide the data strobe signal generator with the control signal for adjusting the timing of the data-related signal transferred to the memory device experiencing the skew failure, based on the DRS reference delay value corresponding to the mounted memory module, wherein the control signal is provided to the data strobe signal generator when the timing skew corresponding to the memory device is outside of the first range based on the DRS reference delay value corresponding to the mounted memory module.

In an exemplary embodiment of the inventive concept, the timing of the data-related signal transmitted to the memory device corresponding to the timing skew outside of the first range is adjusted by using an average offset value of memory devices that passed a write leveling operation.

In an exemplary embodiment of the inventive concept, the mounted memory module includes a dual in-line memory module.

In an exemplary embodiment of the inventive concept, the memory devices include SDRAMs mounted on a substrate of the memory module.

An exemplary embodiment of the inventive concept provides a memory controller which comprises a reference table configured to store DOS reference delay values corresponding to types of memory modules; a clock generator configured to generate a clock signal; a data strobe signal generator configured to generate a data strobe signal with a delay that is adjusted according to a control signal; and a control unit configured to control a transfer of write leveling-related signals to a dual in-line memory module mounted on a target board, the write leveling-related signals including the clock signal, a command, an address, and the data strobe signal, wherein the control unit checks timing skews between the clock signal and data-related signals received from memory devices on the mounted dual in-line memory module, and wherein when a skew failure occurs, the control unit instructs the data signal generator to adjust the delay of the data strobe signal sent to a memory device experiencing the skew failure.

In an exemplary embodiment of the inventive concept, the memory devices are connected on the mounted dual in-line memory module in a fly-by topology.

In an exemplary embodiment of the inventive concept, whether the skew failure occurs is determined by checking whether a timing skew is outside of a first range based on the DQS reference delay value corresponding to the mounted dual in-line memory module.

In an exemplary embodiment of the inventive concept, the delay of the data strobe signal sent to the memory device experiencing the skew failure is adjusted, based on the DQS reference delay value corresponding to the mounted dual in-line memory module and an average offset value of memory devices on the mounted dual in-line memory module that passed a write leveling operation.

In an exemplary embodiment of the inventive concept, the skew failure occurs when a timing skew exceeds a quarter of a period of the clock signal.

In an exemplary embodiment of the inventive concept, the DQS reference delay values are differentiated according to a system-on chip, a target board, or a DIMM type.

In an exemplary embodiment of the inventive concept, the memory controller comprises an algorithm of performing a write leveling operation on a memory module including DDR3 SDRAM devices.

In an exemplary embodiment of the inventive concept, there is provided a write leveling control method comprising: sending write leveling-related signals and a clock signal to a memory module; checking timing skews between the clock signal and data-related signals received from memory devices of the memory module; and adjusting a timing of a data-related signal transferred to a memory device of the memory module whose timing skew is outside of an allowable range based on a reference delay value stored in a memory.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EMBODIMENTS

Figure 1:
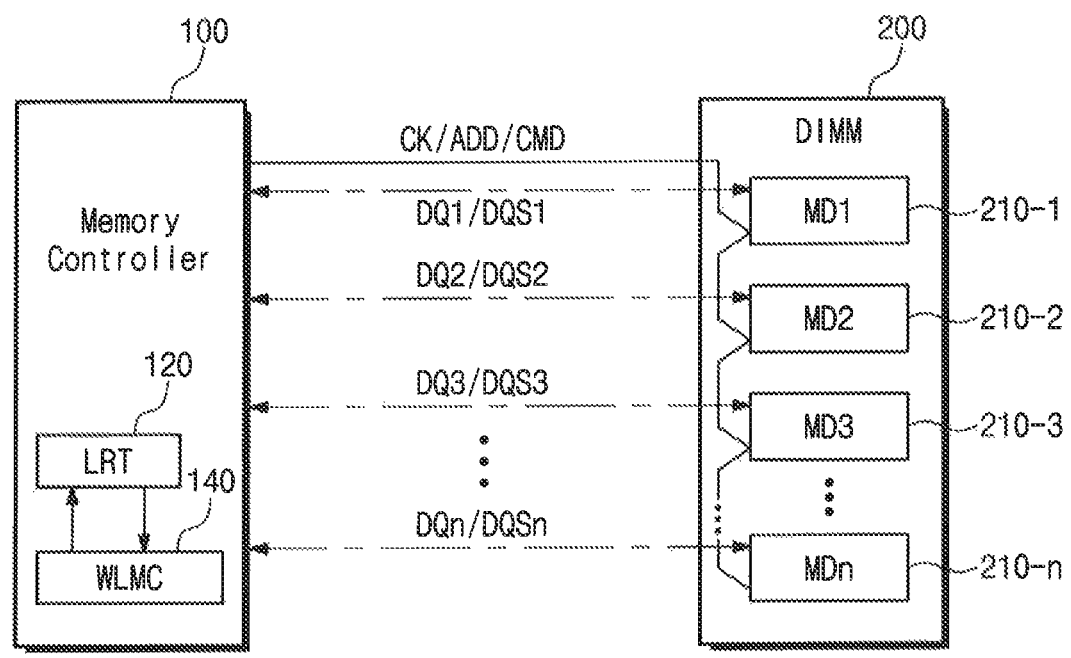
FIG. 1 is a block diagram illustrating a memory system according to an exemplary embodiment of the inventive concept.

Exemplary embodiments of the inventive concept will be described below in detail with reference to the accompanying drawings. The inventive concept, however, may be embodied in various different forms, and should not be construed as being limited only to the illustrated embodiments. Like reference numerals may denote like elements throughout the attached drawings and written description, and thus descriptions may not be repeated. In the drawings, the sizes and relative sizes of layers and regions may be exaggerated for clarity.

As used herein, the singular forms "a", "an" and "the" are intended to include the plural forms as well, unless the context clearly indicates otherwise.

It will be understood that when an element or layer is referred to as being "on", "connected to", "coupled to", or "adjacent to" another element or layer, it can be directly on, connected, coupled, or adjacent to the other element or layer, or intervening elements or layers may be present.

Exemplary embodiments of the inventive concept disclosed herein may include their complementary embodiments. For example, details of data access operations associated with a synchronous dynamic random access memory (SDRAM) and a memory system including a memory module and a memory controller may not be described to avoid repetition.

FIG. 1 is a block diagram illustrating a memory system according to an exemplary embodiment of the inventive concept.

Referring to FIG. 1, a memory system includes a memory controller 100 and a memory module 200.

The memory module 200 includes a plurality of memory devices 210-1 to 210-$n$. The memory module 200 may be a dual in-line memory module (DIMM). The DIMMs may be divided into an unbuffered dual in-line memory module (UDIMM), a very low profile dual in-line memory module (VLP-DIMM), a registered dual in-line memory module RDIMM), and a small outline dual in-line memory module (SO-DIMM) according to their types or topologies. The memory devices 210-1 to 210-$n$ may be formed of volatile semiconductor memories, such as SDRAM double data rate type three (DDR3) and so on. The memory devices 210-1 to 210-$n$ may also be formed of nonvolatile semiconductor memories, such as magnetoresistive random access memory (MRAM), NAND flash memory, and so on.

The memory devices 210-1 to 210-$n$ of the memory module 200 receive a clock signal CK, an address ADD, and a command CMD from the memory controller 100 in a fly-by manner, which means that the clock signal CK, address ADD, and command CMD are connected in series with respect to each memory device 210-1 to 210-$n$. The fly-by manner is exemplary, and the inventive concept is not limited thereto.

The memory controller 100 according to an exemplary embodiment of the inventive concept includes a leveling reference table (LRT) 120 and a write leveling management circuit (WLMC) 140.

The LRT 120 stores data-related signal reference delay values (hereinafter, referred to as DRS reference delay values) corresponding to types of memory modules to be mounted on a target board, as serial presence detect (SPD) information.

After sending write leveling-related signals to for example, the memory module 200 mounted on the target board, the WLMC 140 checks a timing skew between a clock signal and data-related signals received from the memory devices 210-1 to 210-$n$ of the memory module 200.

When a result of checking the timing skew indicates that a skew failure is detected, the WLMC 140 adjusts the timing of a data-related signal transferred to a memory device 210-1 to 210-$n$ of the memory module 200, based on a reference delay value, corresponding to the memory module 200, of the DRS reference delay values.

During a write leveling operation, the memory controller 100 provides the clock signal CK, address ADD, and command CMD to the memory module 200 with the fly-by structure.

In addition, the memory controller 100 provides a data-related signal (e.g., a data strobe signal DQS) to the memory devices 210-1 to 210-$n$ of the memory module 200. The memory controller 100 may also receive data signals DQ from the memory devices 210-1 to 210-$n$ of the memory module 200.

For example, the memory controller 100 provides a data strobe signal DQS1 to the memory device 210-1 and receives a data signal DQ1 therefrom. Likewise, the memory controller 100 provides a data strobe signal DQSn to the memory device 210-$n$ and receives a data signal DQn therefrom.

In FIG. 1, there is illustrated an example where one memory module 200 is connected to one memory controller 100, but the inventive concept is not limited thereto. A plurality of memory modules may be connected to the memory controller 100. In this case, the memory modules may be connected to the memory controller 100 in a daisy chain manner.

Figure 3:
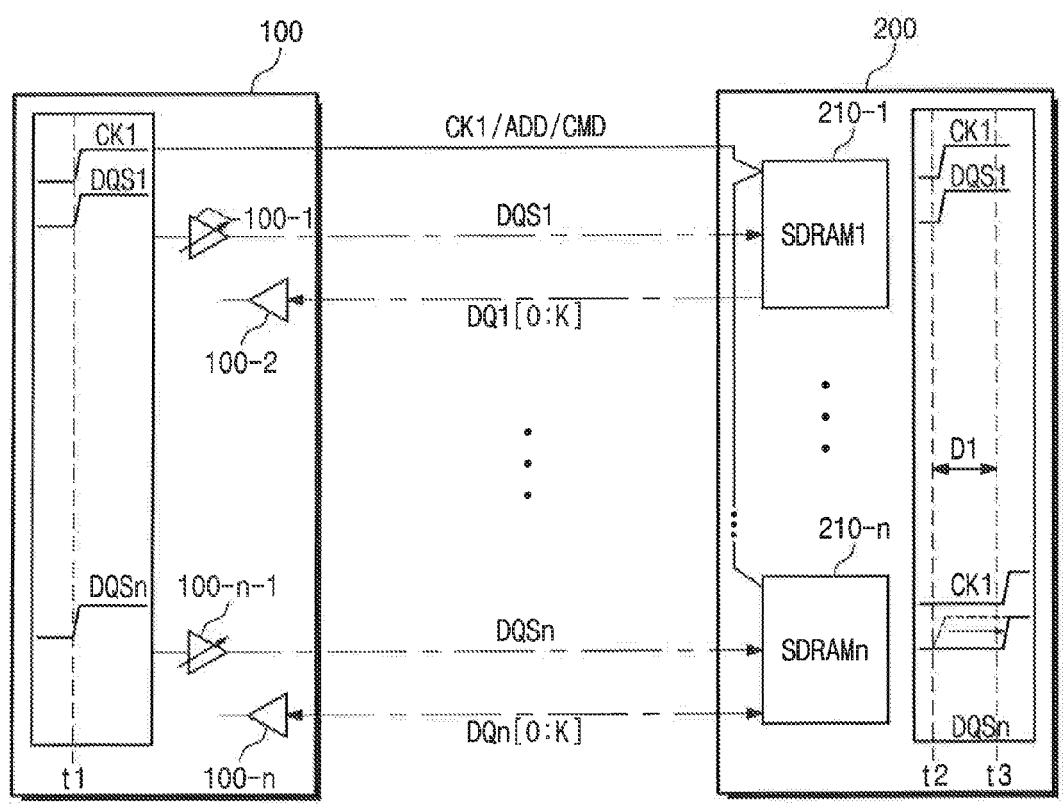
FIG. 3 is a block diagram of a memory system illustrating transmission and reception of write leveling-related signals, in connection with FIG. 1, according to an exemplary embodiment of the inventive concept.

FIG. 3 is a block diagram of a memory system illustrating transmission and reception of write leveling-related signals, in connection with FIG. 1, according to an exemplary embodiment of the inventive concept.

Assume that a memory controller 100 simultaneously generates a clock signal CK1 and data strobe signals DQS1 to DQSn at t1 and sends them to a memory module 200. Flight time skew occurs due to the fly-by topology; thus, a timing skew between the clock CK1 and a data signal DQ1 of a memory device 210-1 is different from a timing skew between the CK1 and a data signal DQn of a memory device 210-n. In this case, the memory controller 100 performs calibration during a write leveling operation to adjust an application time of the data strobe signal DQSn. For example, a time when the data strobe signal DQSn is provided to the memory device 210-n may be adjusted from t2 to t3 according to the calibration thus performed.

Output buffers 100-1 to 100-n−1 shown in FIG. 3 are buffers that provide skew-adjusted data strobe signals. In addition, input buffers 100-2 to 100-n shown in FIG. 3 are buffers that receive data signals of memory devices, such as SDRAM.

In an exemplary embodiment of the inventive concept, a leveling reference table 120 and a write leveling management circuit 140 are provided in the memory controller 100 to stably control write leveling even if calibration fails during the write leveling operation.

Figure 2:
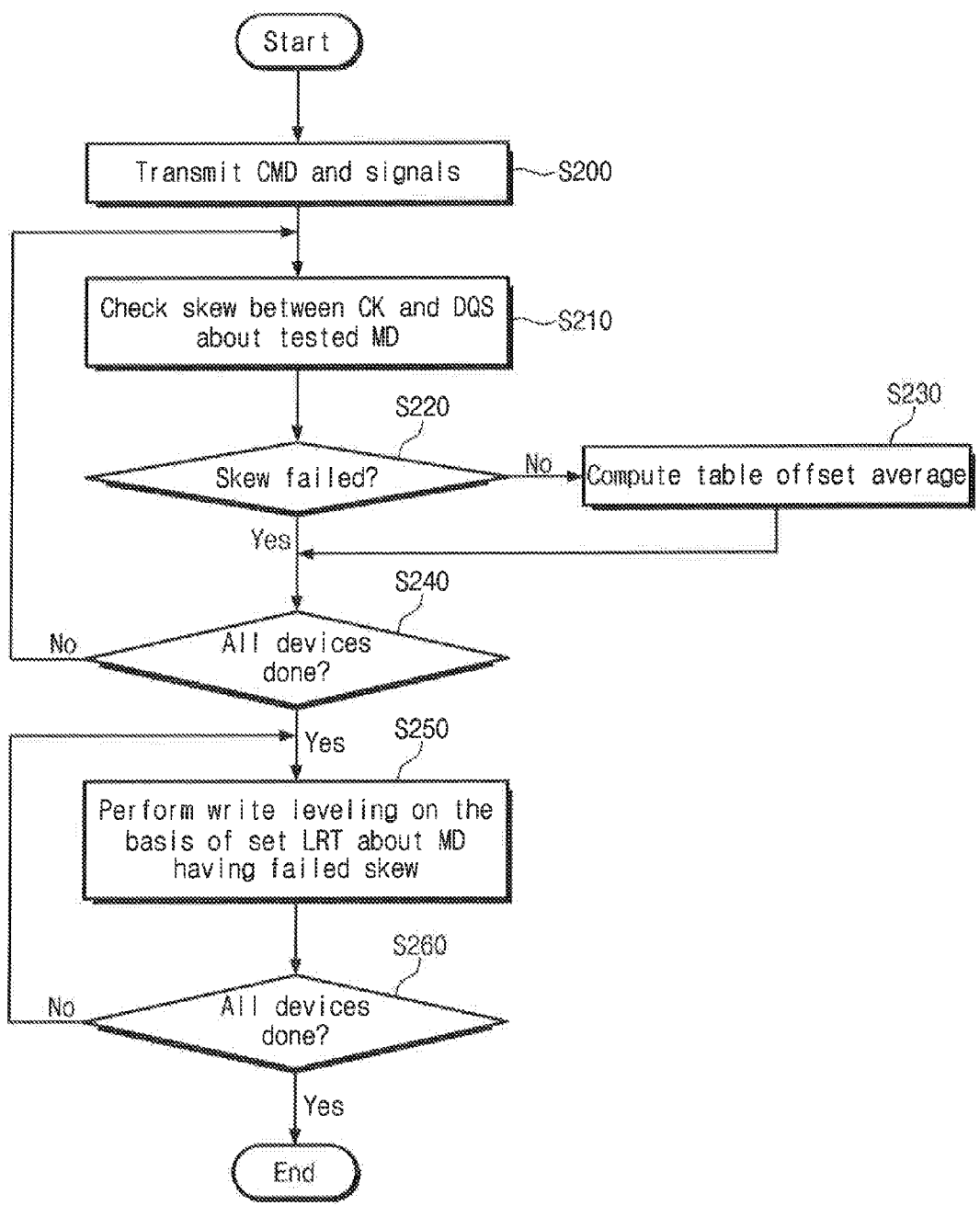
FIG. 2 is a flow chart illustrating write leveling according to an exemplary embodiment of the inventive concept.

FIG. 2 is a flow chart illustrating write leveling according to an exemplary embodiment of the inventive concept. Before step S220 shown in FIG. 2, DQS reference delay values corresponding to types of memory modules may be stored in advance in a leveling reference table 120 to compensate for write leveling. The previously stored values may function as SPD information. The DQS reference delay values may be optimized values obtained by testing target memory modules and comparing the test results with designed values. The leveling reference table 120 may be implemented with a nonvolatile memory, for example, a NAND flash memory.

If it is assumed that any type of DIMM is mounted on a target board, step S200 shown in FIG. 2 is performed. In step S200, write leveling-related signals including a clock signal, a command, an address, and a data strobe signal are transmitted to the DIMM.

As a write leveling management circuit 140 operates, in step S210, there is detected a timing skew between the clock signal and data signals received from memory devices of the DIMM interconnected in a fly-by topology. The detected timing skew may be equal to a timing skew between CK and DQS.

In step S220, whether a skew failure in any memory device occurs may be determined. In other words, the skew failure may mean that the detected timing skew is outside of an allowable range on the basis of one, corresponding to the DIMM mounted, of DQS reference delay values stored in the leveling reference memory 120. For example, if a timing skew between CK and DQS exceeds a quarter of a clock period, calibration fails during a typical write leveling operation. In other words, calibration on a data strobe signal is possible when a timing skew is within 25% of a clock signal.

In the event that a skew failure of a memory device on a memory module does not occur, in other words, if a timing skew is within 25% of a clock signal, in step S230, a table offset average is calculated. In other words, a timing skew of a memory device that is within 25% of a clock signal may be used to obtain a table offset average. Here, reliability may increase in proportion to an increase in the number of memory devices with a timing skew that is within 25% of a clock signal.

In step S240, whether a timing skew of all memory devices has been detected is determined. For example, assume that a memory module includes nine memory devices. With this assumption, the method proceeds to step S250 when the determination indicates that a timing skew of all nine memory devices has been detected.

In step S250, the write leveling management circuit 140 adjusts a timing of the data strobe signal sent to a memory device the timing skew of which is outside of a reference range, based on a reference delay value, corresponding to the mounted memory module, and an average offset value of memory devices determined to be passed during the write leveling operation. In other words, upon a skew failure of an SDRAM 210-n shown in FIG. 3, the write leveling management circuit 140 adjusts an application time of a data strobe signal DQSn from t2 to t3. In step S260, if no other memory devices had a skew failure the process ends; otherwise, step S250 is repeated for the remaining memory devices that had a skew failure.

Figure 4:
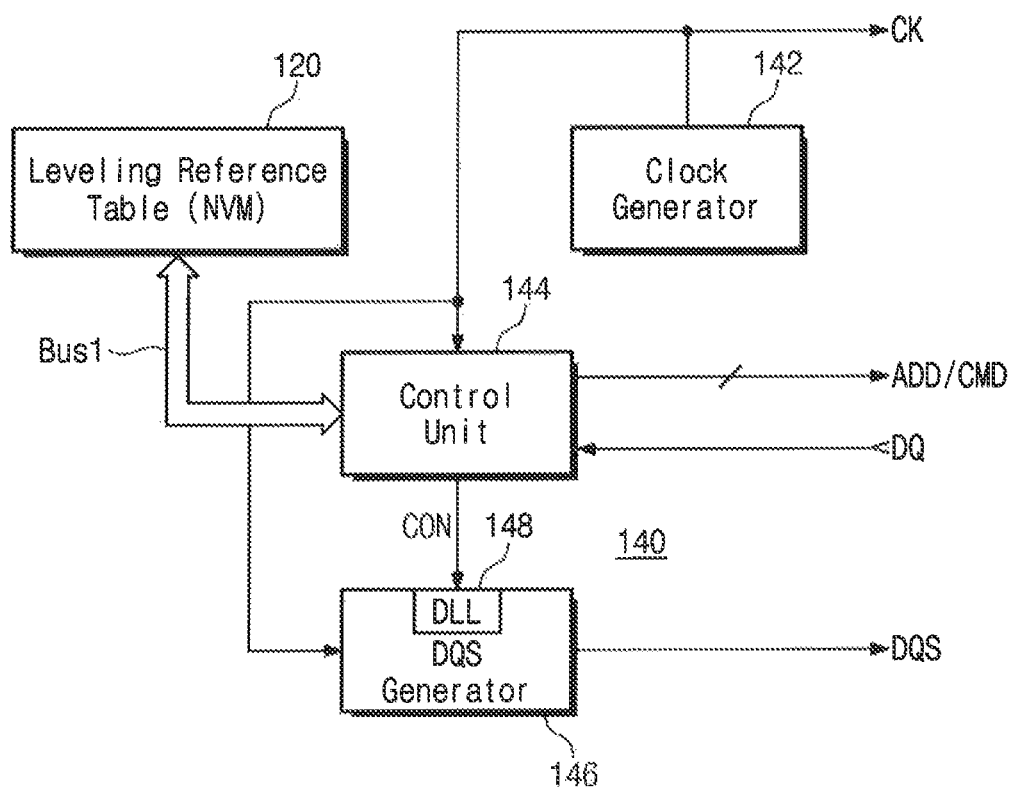
FIG. 4 is a block diagram illustrating a memory controller shown in FIG. 1, according to an exemplary embodiment of the inventive concept.

FIG. 4 is a block diagram illustrating a memory controller shown in FIG. 1, according to an exemplary embodiment of the inventive concept.

Referring to FIG. 4, there is in detail shown a connection between a leveling reference table 120 and a write leveling management circuit 140 constituting a memory controller 100 in FIG. 1 or FIG. 3.

The leveling reference table 120 may be formed of a nonvolatile memory, such as a read only memory (ROM), a flash memory, and so on.

The write leveling management circuit 140 may include a clock generator 142, a control unit 144, and a data strobe signal generator 146. The clock generator 142 generates a clock signal CK, and the data strobe signal generator 146 generates a data strobe signal DQS the delay of which is adjusted according to a control signal CON.

When a timing skew is outside of an allowable range on the basis of a corresponding one of DQS reference delay values stored in the leveling reference table 120, the control unit 144 applies the control signal CON for adjusting a delay timing of a data-related signal sent to a memory device to the data strobe signal generator 146, based on the corresponding DQS reference delay value.

The write leveling management circuit 140 and the leveling reference table 120 are interconnected via a bus Bus1, which transfers a command CMD, an address ADD, and data DQ.

The write leveling management circuit 140 compares a phase of the clock signal CK with a phase of a data signal DQ received from the memory device to determine whether a timing skew between CK and DQS is outside of an allowable range. However, the inventive concept is not limited thereto. For example, the write leveling management circuit 140 may compare a phase of a data strobe signal DQS fed back from the memory device and a phase of the clock signal CK to determine whether a timing skew between CK and DQS is outside of an allowable range.

Upon a skew failure, delay locked loop (DLL) 148 of the data strobe signal generator 146 is controlled by the control signal CON to shift a phase of the data strobe signal DQS. A phase shift operation may differ according to a code state of the control signal CON. For example, there may be used a coarse shift in which ⅛ of a clock period is shifted and a fine shift in which ¹⁄₁₆ of a clock period is shifted.

Figure 5:
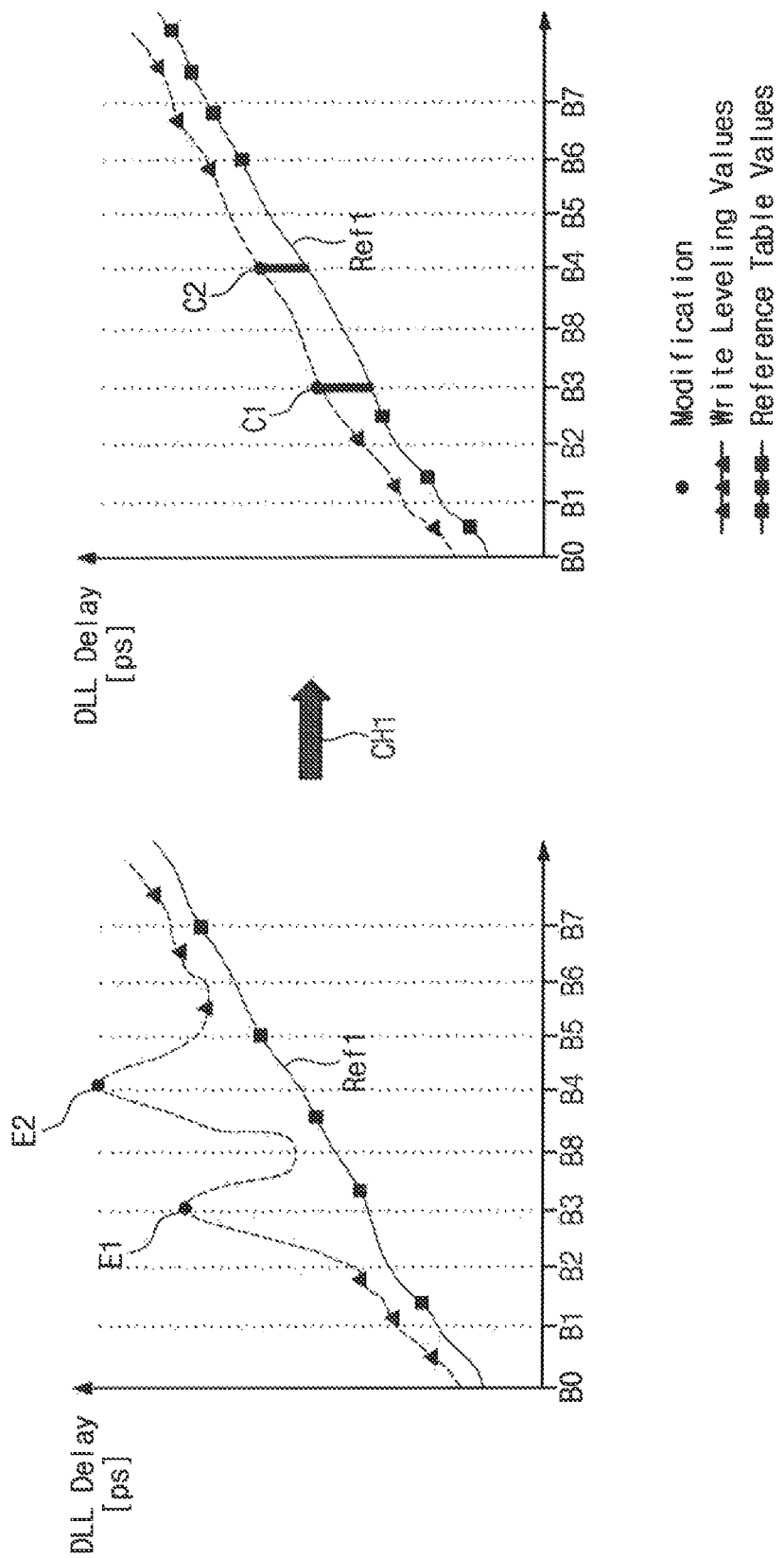
FIG. 5 is a diagram illustrating signal timing calibrated when write leveling of FIG. 2 is performed, according to an exemplary embodiment of the inventive concept.

FIG. 5 is a diagram illustrating signal timing calibrated when write leveling of FIG. 2 is performed, according to an exemplary embodiment of the inventive concept.

Referring to FIG. 5, there is illustrated an example where compensation is made referring to a leveling reference table 120 in the event that the calibration of two (e.g., B3 and B4) of nine memory devices B0 to B8 mounted on a memory module fails during write leveling.

In FIG. 5, a horizontal axis indicates memory devices B0 to B8, and a vertical axis indicates delay (or, timing skew).

Referring to a left-side graph shown in FIG. 5, delays of the memory devices B3 and B4, as marked by reference numerals E1 and E2, exceed more than 25% on the basis of a reference line Ref1. In other words, the memory devices B3 and B4 may be memory devices whose timing skew exceeds ±25% of a clock period. This may mean that write leveling fails in these device.

In addition, there are calculated average offset values between a reference value of the leveling reference table 120 and resultant DQS delay values of memory devices B0, B1, B2, B8, and B5 to B7 that passed the write leveling. Compensation for delays of the failed memory devices B3 and B4 may be performed based on a combination of one, corresponding to a mounted memory module, of DQS reference delay values registered at the leveling reference table 120 and the average offset value.

Referring to a right-side graph shown in FIG. 5, it is understood that compensation for delays of the memory devices B3 and B4 experiencing a skew failure was properly performed, as marked by reference numerals C1 and C2. This is so, because compensation for a phase of a data strobe signal DQS is performed within ±25% of a clock period with respect to a value on the reference line Ref1 based on the leveling reference table 120.

Here, it is understood that a timing skew between CK and DQS is adjusted based on a reference value of the leveling reference table 120 without calculating and reflecting the average offset value.

DQS reference delay values according to types of target boards or DIMM topologies may be individually stored in the leveling reference table 120. Since fault-tolerance techniques specialized according to given system-on chips, target boards, and DIMM types implemented in the leveling reference table 120, write leveling is stably performed regardless of a process, voltage, temperature (PVT) variation of a given platform.

Figure 6:
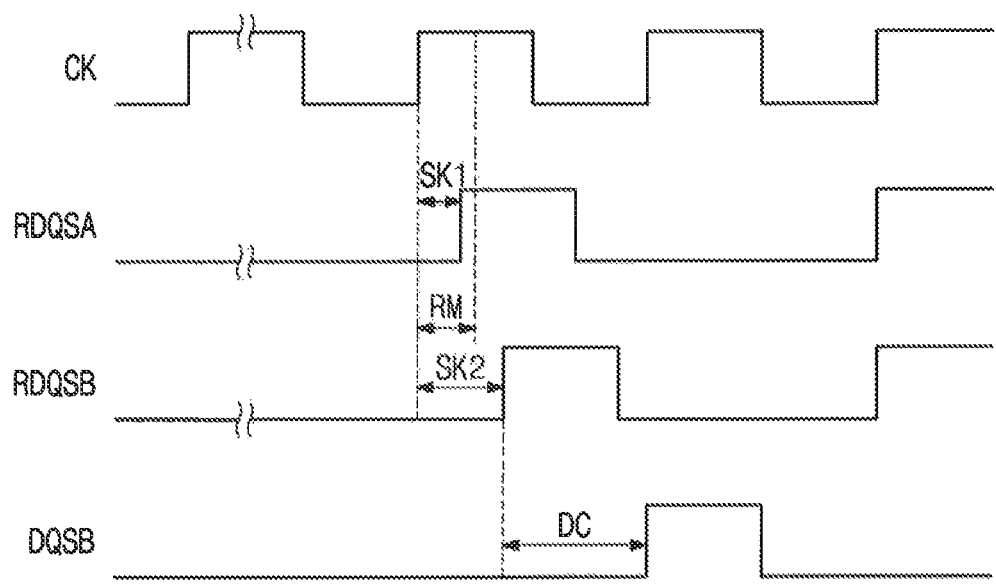
FIG. 6 is a timing diagram illustrating compensation of a timing skew error, according to an exemplary embodiment of the inventive concept.

FIG. 6 is a timing diagram illustrating compensation of a timing skew error, according to an exemplary embodiment of the inventive concept.

Referring to FIG. 6, there are shown a waveform of a clock signal CK and a variety of DQS waveforms.

Since a waveform RDQSA has timing skew SK1 relative to the clock signal CK, a skew failure does not occur. In other words, the timing skew SK1 may correspond to a skew that is within ¼ of a period of the clock signal CK.

In contrast, a waveform RDQSB has timing skew SK2 relative to the clock signal CK; thus, a skew failure occurs. In other words, the timing skew SK2 may correspond to a skew that is outside of ¼ of a period of the clock signal CK.

The waveform RDQSB is adjusted to a waveform DQSB by shifting the waveform RDQSB by a delay compensation period DC. In the event that a signal such as RDQSB is received from a memory device, a phase-adjusted waveform DQSB is applied to the memory device under a control of the control unit 144 shown in FIG. 4.

In an exemplary embodiment of the inventive concept, since write leveling is stably performed regardless of a PVT variation, an operation of writing data at a memory device is performed reliably.

Although a write leveling operation fails due to the PVT variation, it is possible to repair a memory module or memory device whose write leveling fails, by using a table reference algorithm according to an exemplary embodiment of the inventive concept.

This is so, because an exemplary embodiment of the inventive concept does not perform DIMM write leveling using a heuristic algorithm, but rather compensation is made using a DQS delay table specialized according to given system on chips, target boards, and DIMM types. Thus, it is possible to perform more stable and optimized write leveling. In other words, an exemplary embodiment of the inventive concept uses deterministic compensation based on a table value, not unstable heuristic compensation.

The optimized write leveling of an exemplary embodiment of the inventive concept is implemented with a combination of hardware or software. However, the inventive concept is not limited thereto. For example, it is possible to implement the optimized write leveling using, hardware logic or a software algorithm.

As a write leveling target, a variety of memory devices may be used regardless of a type of DIMM or a type of DDR.

Figure 7:
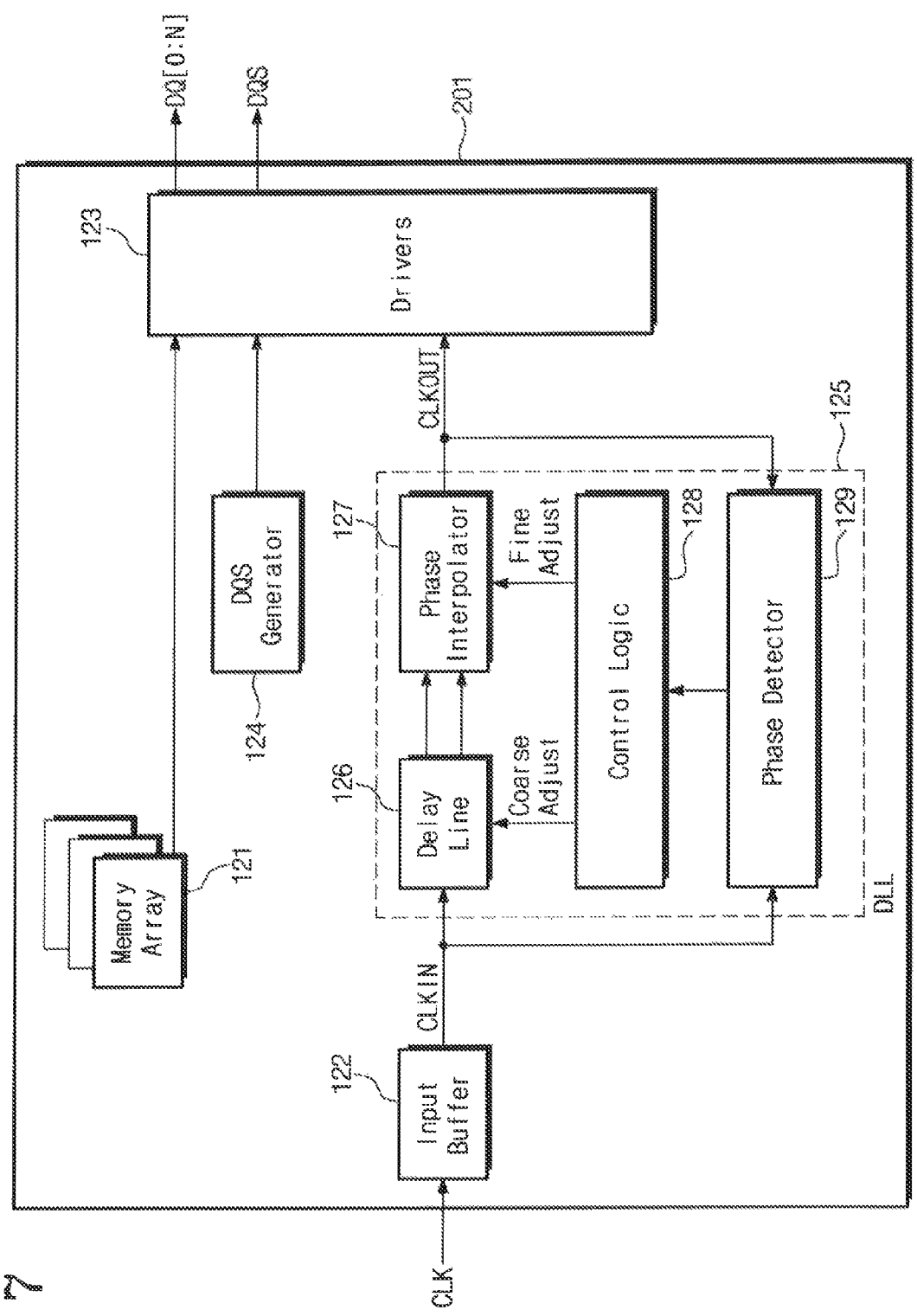
FIG. 7 is a block diagram illustrating a memory device capable of being mounted on a memory module, according to an exemplary embodiment of the inventive concept.

FIG. 7 is a block diagram illustrating a memory device capable of being mounted on a memory module, according to an exemplary embodiment of the inventive concept.

A structure of a dynamic random access memory (DRAM) including a DLL circuit is illustrated in FIG. 7.

A DRAM 201 includes a memory array 121, an input buffer 122 to receive and buffer an external clock signal CLK, a data input/output driver 123, a DQS generator 124 to generate a data strobe signal, and a DLL circuit 125.

In FIG. 7, the DRAM 201 is configured to output the data strobe signal DQS. The DQS generator 124 is configured substantially the same as the DQS generator 146 shown in FIG. 4. In other words, in the event that the DOS generator 146 shown in FIG. 4 is eliminated, the DRAM 201 may include the DQS generator 124.

The data strobe signal DQS is a signal indicating validity of data and is synchronized with the external clock signal CLK. In FIG. 7, "DQ[0:N]" indicates a data input/output line.

The external clock signal CLK is phase locked with a data signal DO or the data strobe signal DQS. Data is transferred to the data input/output line DQ[0:N] through the data input/output driver 123.

The DLL circuit 125 delays an input clock signal CLKIN with appropriate timing, considering delay components generated from a clock tree. A phase of a clock signal used at a data input/output stage is synchronized with that of the external clock signal CLK through the DLL circuit 125.

The DLL circuit 125 includes a delay line 126, a phase interpolator 127, control logic 128, and a phase detector 129. The DLL circuit 125 performs phase shifting to synchronize phases of a target signal and an output signal. The control logic 128 controls the delay line 126 and the phase interpolator 127 to perform coarse adjustment and fine adjustment. The phase detector 129 uses the clock in signal CLKIN and a clock out signal CLKOUT to determine a control signal to provide to the control logic 128.

In FIG. 7, a memory device may be a DRAM. However, the inventive concept is not limited thereto. For example, a memory device according to an exemplary embodiment of the inventive concept may be formed of a resistive memory, such as Phase Change Random Access Memory (PRAM), Resistance Random Access Memory (RRAM), Nano Floating Gate Memory (NFGM), Polymer Random Access Memory (PoRAM), MRAM, Ferroelectric Random Access Memory (FRAM), NAND flash memory, or NOR flash memory.

Figure 8:
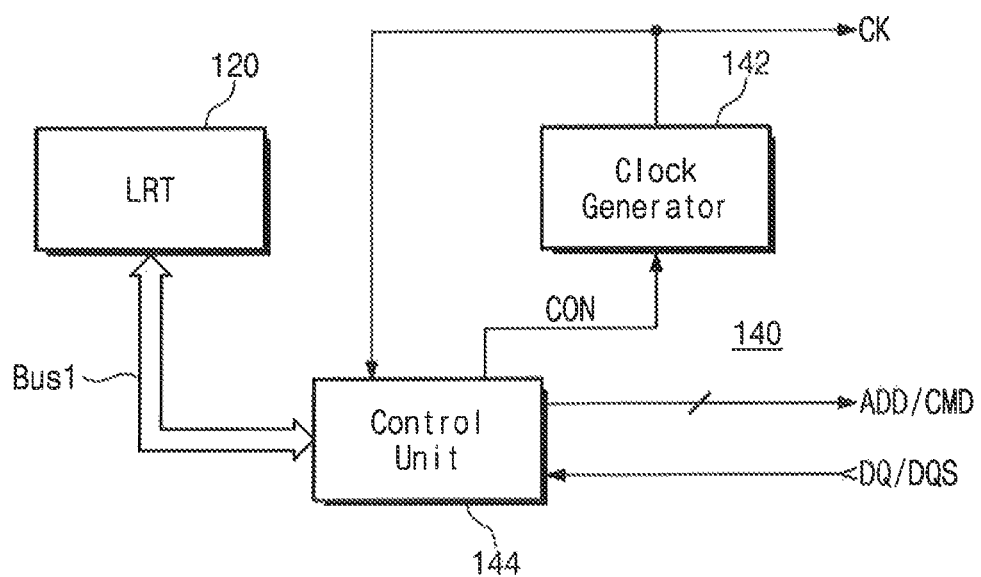
FIG. 8 is a block diagram illustrating a memory controller shown in FIG. 1, according to an exemplary embodiment of the inventive concept.

FIG. 8 is a block diagram illustrating a memory controller shown in FIG. 1, according to an exemplary embodiment of the inventive concept.

Referring to FIG. 8, a connection between a leveling reference table 120 and a write leveling management circuit 140 constituting a memory controller 100 is shown in detail and is different from that shown in FIG. 4.

The leveling reference table 120 may be formed of a nonvolatile memory, such as a ROM, a flash memory, and so on.

The write leveling management circuit 140 contains a clock generator 142 and a control unit 144. The clock generator 142 generates a clock signal CK. A data strobe signal generator that generates a data strobe signal DQS may be placed inside of a DRAM like DQS generator 124 shown in FIG. 7.

In this case, the control unit 144 detects a timing skew between a transferred clock signal CK and a received data strobe signal DQS. A timing skew failure occurs when the detected timing skew is outside of an allowable range on the basis of a corresponding one of DQS reference delay values stored in the leveling reference table 120.

The control unit 144 applies a control signal CON for adjusting delay timing of a clock signal CK sent to a memory device (e.g., the DRAM), based on a corresponding DQS reference delay value of the leveling reference table 120.

The write leveling management circuit 140 and the leveling reference table 120 are interconnected via a bus Bus1, which transfers a command CMD, an address ADD, and data DQ.

The write leveling management circuit 140 compares a phase of the clock signal CK with a phase of a data signal DQ received from the memory device to determine whether a timing skew between CK and DQS fails.

Figure 9:
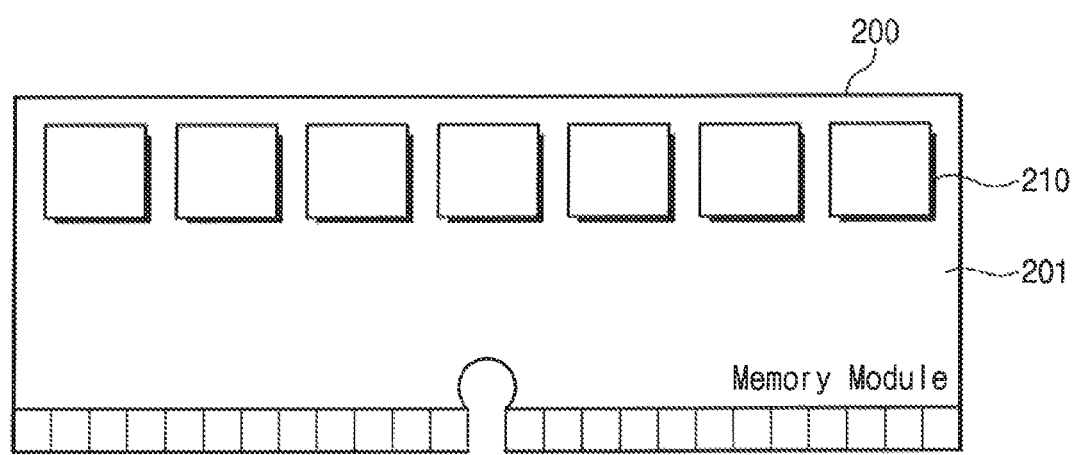
FIG. 9 is a diagram illustrating an exterior of a memory module according to an exemplary embodiment of the inventive concept.

FIG. 9 is a diagram illustrating an exterior of a memory module according to an exemplary embodiment of the inventive concept.

Referring to FIG. 9, a memory module 200 includes a plurality of memory devices 210 mounted on a substrate 201, such as a printed circuit board (PCB). The memory module 200, for example, may be a single in-line memory module SIMM), a DIMM, a RDIMM, a UDIMM, a SO-DIMM, or an error check & correction small outline dual in-line memory module (ECC-SODIMM).

Figure 10:
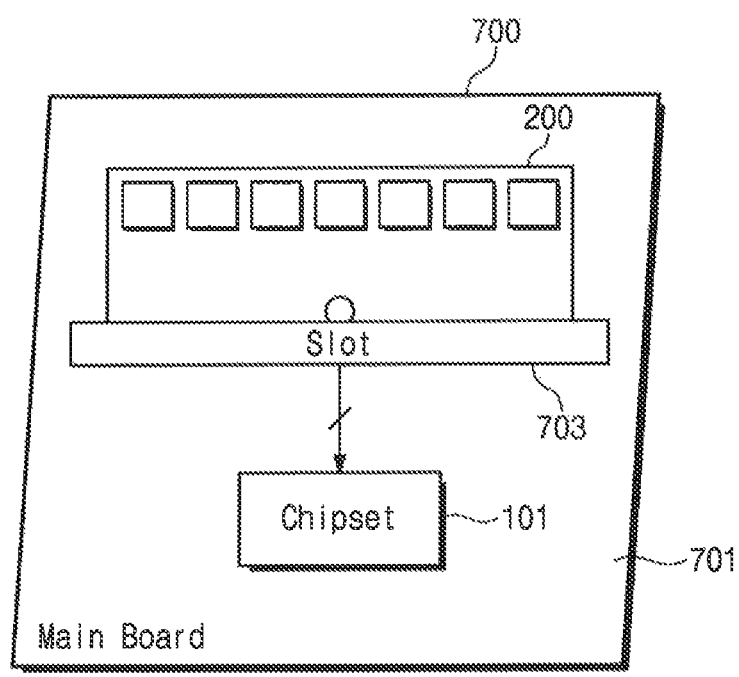
FIG. 10 is a diagram illustrating a memory system including a memory module shown in FIG. 9, according to an exemplary embodiment of the inventive concept.

FIG. 10 is a diagram illustrating a memory system including a memory module shown in FIG. 9, according to an exemplary embodiment of the inventive concept.

Referring to FIG. 10, a memory system 700 includes a memory module 200 and a chipset 101. The chipset 101 may include the memory controller 100 shown in FIG. 1. A main board 701 of the memory system 700 includes one or more slots 703 in which the memory module 200 is inserted. In addition, a microprocessor or a central processing unit may be mounted on the main board 701.

The memory system 700 shown in FIG. 10 is applicable to a computer system, such as personal computer (PC), laptop computer, or storage server.

In FIG. 10, the chipset 101 may include a leveling reference table 120 and a write leveling management circuit 140 to perform a write leveling operation for checking a timing skew between a clock signal CK and a data strobe signal DQS and adjusting an output timing of the data strobe signal DOS.

The write leveling operation may be performed upon power-on of the memory system, upon detection of a PVT variation, or periodically.

Figure 11:
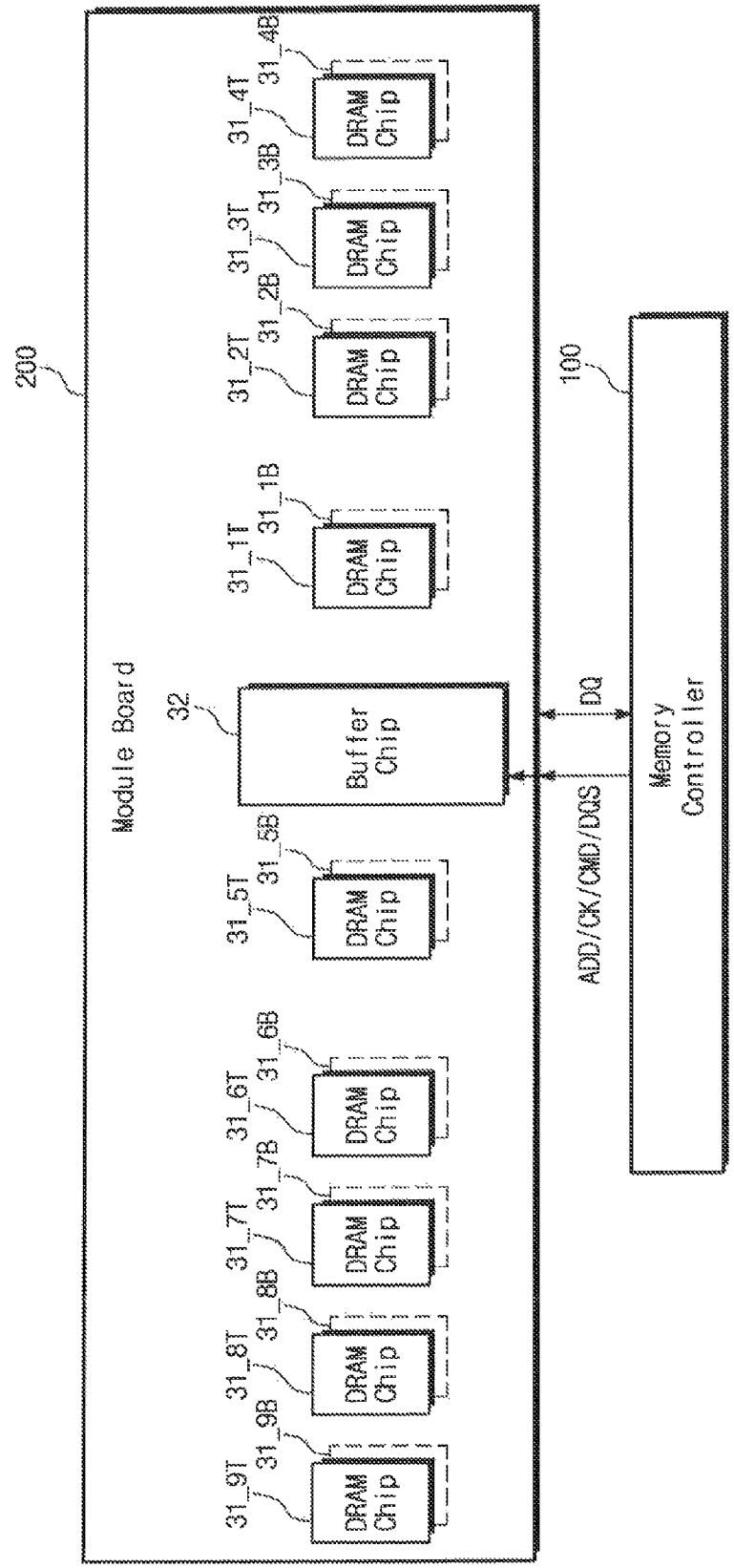
FIG. 11 is a block diagram illustrating a layout of a memory module shown in FIG. 1, according to an exemplary embodiment of the inventive concept.

FIG. 11 is a block diagram illustrating a layout of a memory module shown in FIG. 1, according to an exemplary embodiment of the inventive concept.

In FIG. 11, there is illustrated an RDIMM. A memory controller 100 sends a data signal DO to a memory module 200 and receives a data signal DO from the memory module 200. The memory controller 100 may also output a clock signal CK, a command CMD, an address ADD, and a data strobe signal DQS to the memory module 200.

The memory module 200 includes a buffer chip 32 and a plurality of memory chips 31_1T to 31_9T and 31_1B to 31_9B. The buffer chip 32 buffers a command CMD, an address ADD, a clock signal CK, and a control signal for example, a data strobe signal DQS from the memory controller 100 to transmit the buffered signals to the memory chips 31_1T to 31_9T and 31_1B to 31_9B.

Each of the memory chips 31_1T to 31_9T and 31_1B to 31_9B may be an SDRAM, which outputs data to the memory controller 100 in synchronization with a system clock signal and stores data received from the memory controller 100. Each of the memory chips 31_1T to 31_9T and 31_1B to 31_9B may be a DDR3 or a double data rate fourth generation (DDR4) SDRAM.

The memory chips 31_1T to 31_9T and the memory chips 31_1B to 31_9B may be disposed on an upper surface and a lower surface of a module board to correspond to one another. The memory chips 31_1T to 31_9T may be disposed in a line on the upper surface of the module board, and the memory chips 31_1B to 31_9B may be disposed in a line on the lower surface of the module board.

The memory chips 31_1T to 31_9T and the memory chips 31_1B to 31_9B may correspond to memory devices described with reference to the above-described drawings.

Figure 12:
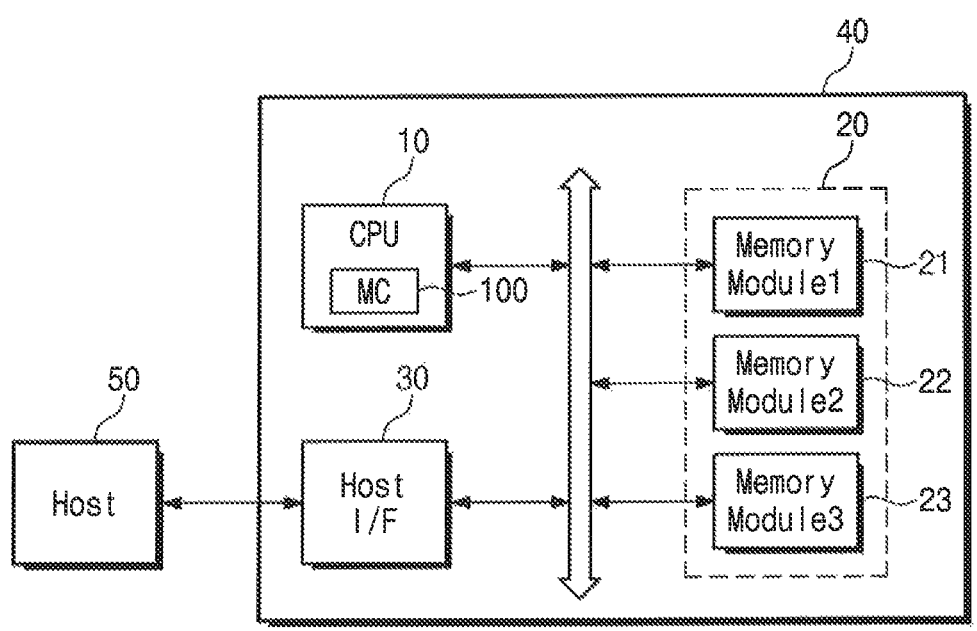
FIG. 12 is a block diagram illustrating a data processing system according to an exemplary embodiment of the inventive concept.

FIG. 12 is a block diagram illustrating a data processing system according to an exemplary embodiment of the inventive concept.

Referring to FIG. 12, a data processing system includes a central processing unit (CPU) 10, a system memory 20, a host interface 30, a main board 40, and a host 50.

The CPU 10 includes a memory controller (MC) 100 to control the system memory 20. The memory controller 100 may be implemented as a component of the CPU 10 or be independent from the CPU 10. The system memory 20 stores data to be accessed by the CPU 10. For example, the system memory 20 includes a plurality of memory modules 21, 22, and 23. The system memory 20 includes a first memory module 21 as a basic memory component. The system memory 20 may further comprise a second memory module 22 and a third memory module 23 for an increase in memory capacity. Here, at least one of the memory modules 21 to 23 may be implemented with a combination of DRAM and SRAM.

The host interface 30 is configured to interface with the host 50 according to a control of the CPU 10. For example, the host interface 30 may include at least one of a Serial Advanced Technology Attachment (SATA) interface, a Parallel Advanced Technology Attachment (PATA) interface, a Universal Serial Bus (USB) interface, a Peripheral Component Interconnect (PCI) interface, a Peripheral Component Interconnect Express (PCI-EXPRESS) interface, and a Serial Attached Small Computer Small Interface (SAS) interface.

The host 50 performs data communications with the CPU 10 through the host interface 30.

The data processing system shown in FIG. 12 may function as a hard disk drive (HDD) or a solid state drive (SSD). In addition, the data processing system may function as a notebook computer, a PC, a workstation, or a server.

In FIG. 12, the memory controller 100 may include a leveling reference table 120 and a write leveling management circuit 140 to perform a write leveling operation for checking a timing skew between a clock signal CK and a data strobe signal DQS and adjusting an output timing of the data strobe signal DQS. Thus, a reliable write operation of the data processing system is possible.

Figure 13:
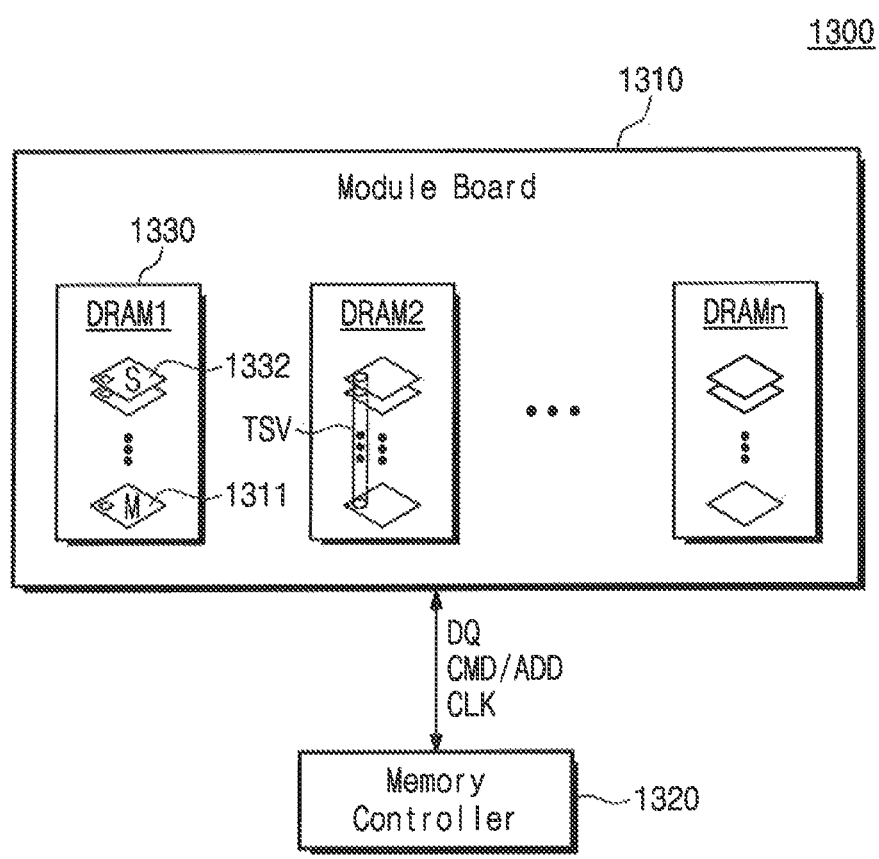
FIG. 13 is a block diagram illustrating a memory system according to an exemplary embodiment of the inventive concept.

FIG. 13 is a block diagram illustrating a memory system according to an exemplary embodiment of the inventive concept.

Referring to FIG. 13, a memory system 1300 includes a memory module 1310 and a memory controller 1320. The memory module 1310 may include at least one or more semiconductor memory devices 1330 mounted on a module board. The semiconductor memory devices 1330 may be implemented with a DRAM chip. The semiconductor memory devices 1330 may include a plurality of semiconductor layers. The semiconductor layers may include one or more master chips 1331 and one or more slave chips 1332.

A signal transfer among the semiconductor layers may be performed using a through-silicon via (TSV) structure. In addition, a signal transfer among the semiconductor layers may be performed using an optical input/output connection.

The master chip 1331 and the slave chip 1332 may include a memory array, a storage unit, and a refresh unit.

The memory module 1310 communicates with the memory controller 1320 through a system bus. A data signal DQ, a command/address CMD/ADD, a clock signal CLK, etc. may be exchanged between the memory module 1310 and the memory controller 1320 through the system bus. A signal transfer between the memory module 1310 and the memory controller 1320 may be performed using an optical input/output connection.

In FIG. 13, the memory controller 1320 may include a leveling reference table 120 and a write leveling management circuit 140 to stably perform a write leveling operation.

Figure 14:
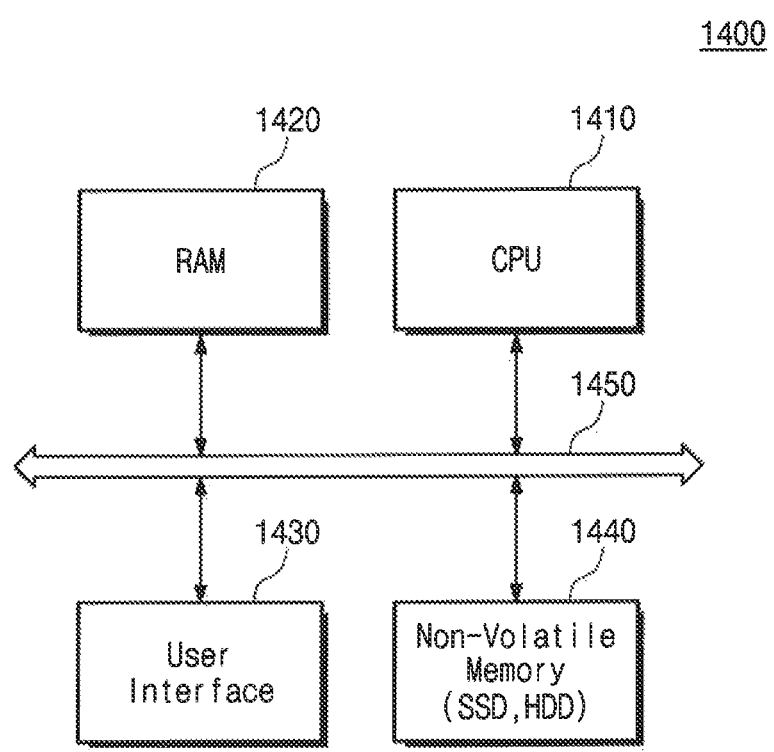
FIG. 14 is a block diagram illustrating a computing system including a memory system shown in FIG. 13, according to an exemplary embodiment of the inventive concept.

FIG. 14 is a block diagram illustrating a computing system including a memory system shown in FIG. 13, according to an exemplary embodiment of the inventive concept.

Referring to FIG. 14, a computing system 1400, such as a mobile device or a desktop computer, may include a semiconductor memory device according to an exemplary embodiment of the inventive concept as a RAM 1420. The semiconductor memory device used as the RAM 1420 may be implemented in the memory module form.

The computing system 1400 further contains a central processing unit (CPU) 1410, a user interface 1430, and a nonvolatile memory 1440. The components 1410 to 1440 of the computing system 1400 may be connected to one another through a bus 1450. The nonvolatile memory 1440 may be implemented with a mass storage device, such as SSD or HDD.

In FIG. 14, the CPU 1410 may include a leveling reference table 120 and a write leveling management circuit 140 to stably perform a write leveling operation.

In FIG. 14, there is illustrated an example in which the computing system 1400 includes the RAM 1420. In some examples, an MRAM may be used instead of the RAM 1420. A volatile semiconductor memory device, such as an SRAM or a DRAM, may lose data stored therein at power-off. In contrast, a nonvolatile semiconductor memory device, such as an MRAM, may retain data stored therein even at power-off. Thus, the nonvolatile semiconductor memory device may be used to prevent data from being lost in the event of power failure or power interruption.

In the event that Spin transfer torque magneto resistive random access memory (STT-MRAM) is used instead of the RAM 1420, the CPU 1410 may stably perform a write leveling operation.

An STT-MRAM cell has a Magnetic Tunnel Junction (MTJ) element and a selection transistor. For example, the MTJ element may contain a fixed layer, a free layer, and a tunnel layer formed between the fixed layer and the free layer. A magnetization direction of the fixed layer is fixed, and a magnetization direction of the free layer may be the same as or opposite to that of the fixed layer according to the magnetization direction of the free layer.

Figure 15:
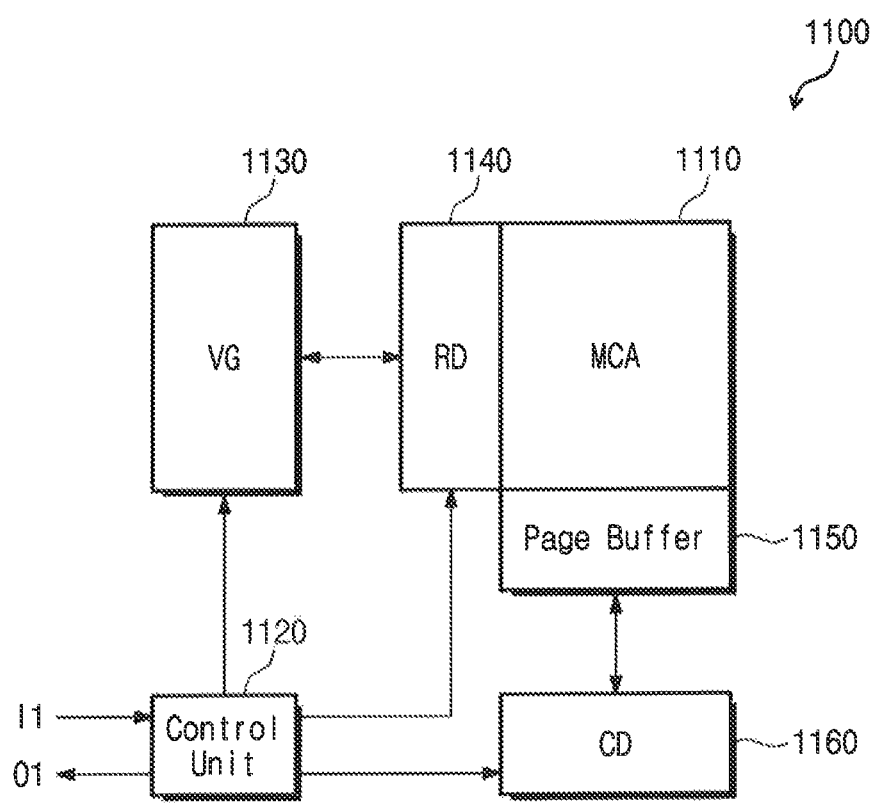
FIG. 15 is a block diagram illustrating a memory device mounted on a memory module shown in FIG. 1, according to an exemplary embodiment of the inventive concept.

FIG. 15 is a block diagram illustrating a memory device mounted on a memory module shown in FIG. 1, according to an exemplary embodiment of the inventive concept.

Referring to FIG. 15, a nonvolatile memory device 1100 includes a memory cell array (MCA) 1110, a control unit 1120, a voltage generator (VG) 1130, a row decoder (RD) 1140, a page buffer 1150, and a column decoder (CD) 1160. If the nonvolatile memory device 1100 is a NAND flash memory, the memory cell array 1110 is configured to have a plurality of memory cell strings arranged in a memory block. The control unit 1120 provides the voltage generator 1130, the row decoder 1140, and the column decoder 1160 with control signals according to an operation to be performed, for example: an erase operation, a program operation, or a read operation.

The voltage generator 1130 generates voltages necessary to operate a memory device, for example, a pass voltage Vpass, a read voltage Vread, an erase voltage Verase, a step voltage Vstep, and so on. Based on a mode of operation, the row decoder 1140 provides voltages from the voltage generator 1130 to lines of the memory cell array 1110 such as a string selection line SSL, a word line WLk, a ground selection line GSL, a common source line CSL, and so on. The column decoder 1160 connects bit lines BLn of the memory cell array 1110 to the page buffer 1150. The column decoder 1160 may decide voltages to be applied to the bit lines BLn during a program or erase operation.

In addition, during a write leveling operation, the control unit 1120 receives a command (e.g., a write command), a write leveling enable signal, and a data strobe signal through an input terminal 11 from a memory controller. The control unit 1120 may detect a phase difference between an internal command signal (e.g., an internal write command signal), which is internally generated in response to the command and clock signals, and an internal data strobe signal, which is internally generated in response to the data strobe signal. The control unit 1120 outputs detection information, indicating information about the detected phase difference, through an output terminal O1 connected to the memory controller.

In FIG. 15, the memory controller 1320 of FIG. 13 may be used and may include a leveling reference table 120 and a write leveling management circuit 140 to stably perform a write leveling operation for the nonvolatile memory device 1100.

Figure 16:
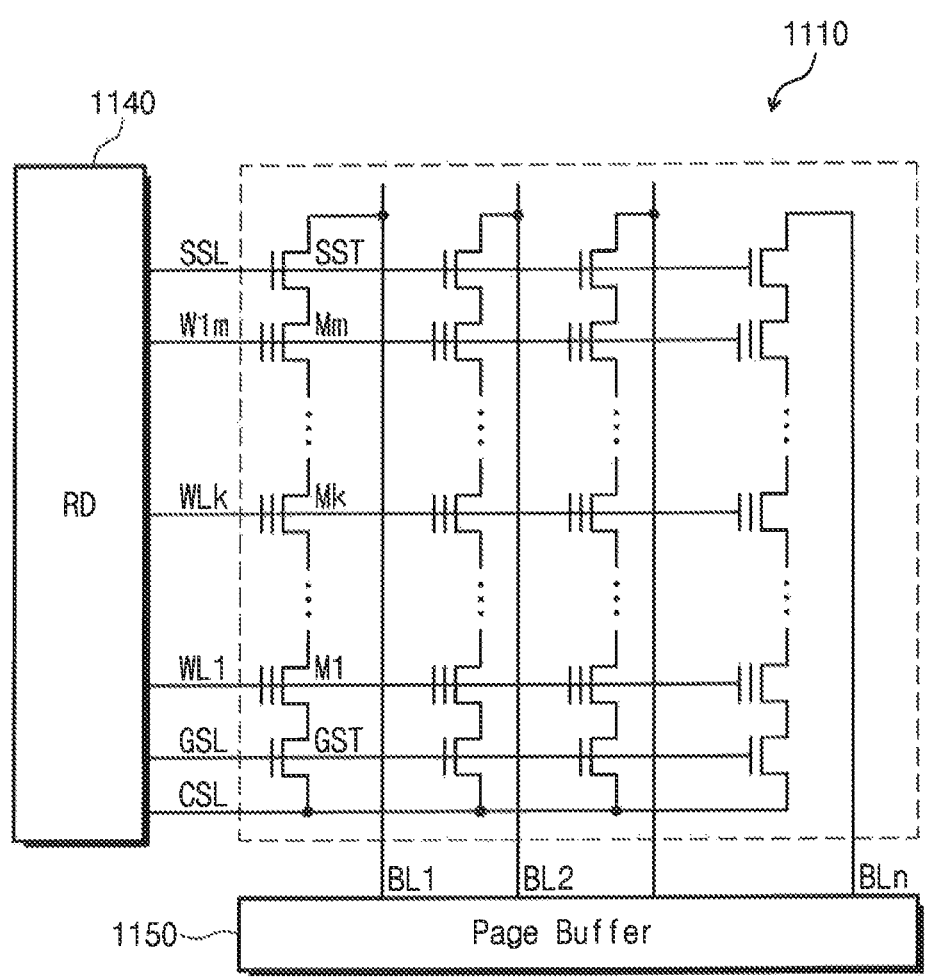
FIG. 16 is a circuit diagram illustrating a memory cell array of a nonvolatile memory device shown in FIG. 15, according to an exemplary embodiment of the inventive concept.

FIG. 16 is a circuit diagram illustrating a memory cell array 1110 of the nonvolatile memory device 1100 shown in FIG. 15.

A row decoder (RD) 1140 applies a variety of voltages to one or more string selection lines SSL, word lines W1$m$ to WLk to WL1, a ground selection line GSL, and a common source line CSL. A page buffer 1150 is connected to bit lines BL1 to BLn of memory cell strings. Each memory cell string may include a plurality of memory cells Mm to Mk to M1, a string selection transistor SST and a ground selection transistor GST.

In FIG. 16, there is illustrated an example in which the memory cell array 1110 is a memory cell array of a NAND flash memory device. However, the inventive concept is not limited thereto. For example, the memory cell array 1110 according to an exemplary embodiment of the inventive concept may include a memory cell array of a DDR3 SDRAM.

Besides the memory cell array shown in FIG. 16, there may be used a memory cell array of a nonvolatile memory such as an Electrically Erasable Programmable Read-Only Memory (EEPROM), a flash memory, an MRAM, an SIT-MRAM, a conductive bridging RAM (CBRAM), an FRAM, a PRAM also called ovonic unified memory (OUM), an RRAM, a nanotube RRAM, a polymer RAM (PoRAM), a nano floating gate memory (NFGM), a holographic memory, a molecular electronics memory device, or an insulator resistance change memory.

Figure 17:
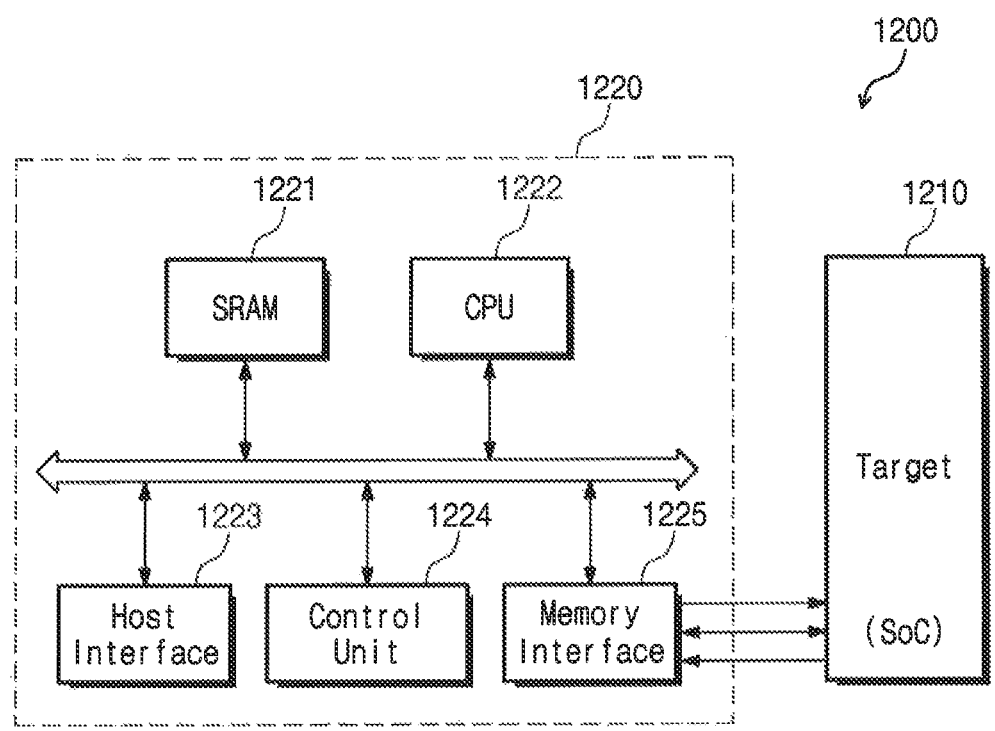
FIG. 17 is a block diagram illustrating an application of an exemplary embodiment of the inventive concept in a memory card.

FIG. 17 is a block diagram illustrating an application of an exemplary embodiment of the inventive concept in a memory card.

Referring to FIG. 17, a memory card 1200 contains a memory controller 1220 to generate a command and an address and a target 1210 such as a memory module.

The target 1210 may be implemented with a flash memory including a plurality of flash memory devices or an SDRAM. The target 1210 may be implemented with a system-on-chip (SoC).

The memory controller 1220 comprises a host interface 1223 to exchange a command and an address between a host and the memory controller 1220 and a memory interface 1225 to exchange a command and an address between the target 1210 and the memory controller 1220.

The memory controller 1220 may also contain an SRAM 1221, a processor 1222, and a control unit 1224.

The components 1223, 1224, and 1225 of the memory controller 1220 communicate with the SRAM 1221 and the processor (e.g., CPU) 1222 through a common bus.

In addition, during a write leveling operation, the control unit 1224 of the memory controller 1220 outputs a command signal, a write leveling signal, and a data strobe signal for the write leveling operation to at least one of a plurality of memory devices of the target 1210 through the memory interface 1225.

Components of the memory card 1200 including circuit blocks 1221 to 1225 may be included in the memory controller 1220. The target 1210 may include at least one of a memory module or a nonvolatile memory module.

Chips of the target 1210 and the CPU 1222 shown in FIG. 17 may be packaged independently or together according to any of a variety of different packaging technologies. Examples of such packaging technologies may include Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline Integrated Circuit (SOIC), Shrink Small Outline Package (SSOP), Thin Small Outline Package (TSOP), Thin Quad Flatpack (TQFP), System In Package (SIP), Multi Chip Package (MCP), Wafer-level Fabricated Package (WFP), Wafer-Level Processed Stack Package (WSP), and the like.

Figure 18:
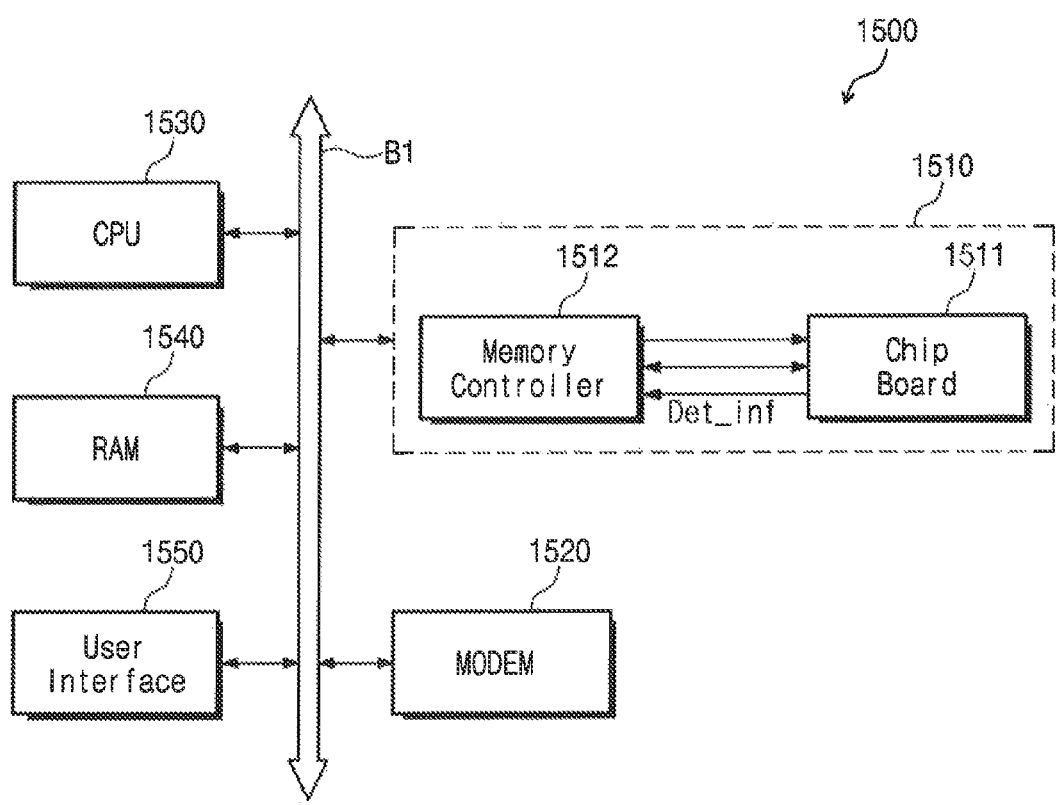
FIG. 18 is a block diagram illustrating an application of an exemplary embodiment of the inventive concept in a mobile device.

FIG. 18 is a block diagram illustrating an application of an exemplary embodiment of the inventive concept used in a mobile device.

A mobile device 1500 includes a memory system 1510, a modem 1520, a processor (e.g., CPU) 1530, a RAM 1540, and a user interface 1550, which communicate with one another via a common bus B1.

The memory system 1510 is connected to the processor 1530 through the common bus B1.

A memory controller 1512 of the memory system 1510 performs a write leveling operation referring to a reference memory according to an exemplary embodiment of the inventive concept.

A chip board 1511 may be provided with a command, a clock signal, a write leveling control signal, and a data strobe signal for a write leveling operation. A memory device of the chip board 1511 generates an internal command signal in response to the command and clock signal. In addition, the memory device of the chip board 1511 generates an internal data strobe signal in response to the data strobe signal. In the event that a phase error between the internal command signal and the internal data strobe signal is detected within the memory device, the memory device provides the detected phase error to the memory controller 1512 as skew information Det_inf. The memory controller 1512 adjusts output timing of the data strobe signal based on the skew information Det_inf.

The memory system 1510 shown in FIG. 18 may be used in a variety of applications, for example: in devices such as an SSD, a camera image sensor (CIS), and a computer application chipset.

The memory system 1510 may be packaged according to any of a variety of different packaging technologies. Examples of such packaging technologies may include BGAs, CSPs, PLCC, MCP, WSP, and the like.

An interface between the CPU 1530 and the memory controller 1512 may be implemented using a variety of protocols. The memory controller 1512 uses at least one of various protocols such as a USB protocol, a multimedia card (MMC) protocol, a PCI protocol, a PCI-E protocol, an Advanced Technology Attachment (ATA) protocol, a SATA protocol, a PATA protocol, an SCSI protocol, an enhanced small disk interface (ESDI) protocol, and an Integrated Drive Electronics (IDE) protocol.

The device shown in FIG. 18 may be provided as one of various components of an electronic device such as a computer, a ultra-mobile personal computer (UMPC), a workstation, a net-book, a personal digital assistant (PDA), a PC, a web tablet, a wireless phone, a mobile phone, a smart phone, a smart television, a three-dimensional television, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, a device for transmitting and receiving information in a wireless environment, one of various electronic devices constituting a home network, one of various electronic devices constituting a computer network, one of various electronic devices constituting a telematics network, a radio frequency identification (RFID) device, and one of various components constituting a computing system.

While the inventive concept has been described with reference to exemplary embodiments thereof, it will be apparent to those of ordinary skill in the art that various changes and modifications may be made thereto without departing from the spirit and scope of the inventive concept as defined by the following claims.

For example, thereinabove is described an example in which a memory controller performs write leveling. In some cases, however, changes or modifications to the reference table based write leveling may be made by changing circuit components of drawings or adding or subtracting components without departing from the spirit and scope of the inventive concept. In addition, write leveling according to an exemplary embodiment of the inventive concept is mainly described using a DIMM module. However, the inventive concept is applicable to other semiconductor modules.

What is claimed is:

1. A write leveling control method, comprising:
registering data-related signal (DRS) reference delay values corresponding to types of memory modules in a reference table;
transmitting write leveling-related signals to a first type of memory module mounted on a target board;
detecting timing skews between a clock signal and data-related signals received from memory devices on the mounted memory module; and
adjusting a delay of a data-related signal transmitted to a memory device of the mounted memory module if a corresponding timing skew is outside of a first range, based on the DRS reference delay value corresponding to the mounted memory module.

2. The write leveling control method of claim 1, wherein the data-related signals comprise a data strobe signal indicating validity of an associated data signal.

3. The write leveling control method of claim 1, wherein the memory devices include a double data rate type three (DDR3) synchronous dynamic random access memory (SDRAM).

4. The write leveling control method of claim 1, wherein the mounted memory module includes an unbuffered dual in-line memory module (UDIMM), a very low profile dual in-line memory module (VLPDIMM), a registered dual in-line memory module (RDIMM), or a small outline dual in-line memory module (SODIMM).

5. The write leveling control method of claim 1, wherein the DRS reference delay values are differentiated according to a topology of the target board.

6. The write leveling control method of claim 1, wherein when a timing skew exceeds more than 23% of the DRS reference delay value corresponding to the mounted memory module, the delay of the data-related signal transmitted to the memory device corresponding to the timing skew outside of the first range is adjusted by referring to that DRS reference delay value.

7. The write leveling control method of claim 6, wherein the delay of the data-related signal transmitted to the memory device corresponding to the timing skew outside of the first range is adjusted by using an average offset value of memory devices that passed a write leveling operation.

8. A write leveling control method, comprising:
storing data strobe signal (DQS) reference delay values corresponding to types of dual in-line memory modules in a reference memory as serial presence detect (SPD) information;
identifying a type of dual in-line memory module mounted on a target board using the SPD information and providing the mounted dual in-line memory module with write leveling-related signals including a clock signal, a command, an address, and a data strobe signal;
detecting timing skews between the clock signal and data strobe signals received from memory devices on the mounted dual in-line memory module; and
adjusting a timing of a data strobe signal transmitted to the memory device corresponding to a timing skew outside of a first range, based on an average offset value of memory devices that passed a write leveling operation and the DQS reference delay value corresponding to the mounted dual in-line memory module.

9. The write leveling control method of claim 8, wherein the dual in-line memory module includes a buffer chip when the memory devices include a double data rate type three (DDR3) synchronous dynamic random access memory (SDRAM).

10. The write leveling control method of claim 8, wherein the dual in-line memory module includes a double data rate type three (DDR3) dual in-line memory module (DIMM).

11. The write leveling control method of claim 8, wherein the DQS reference delay values are differentiated according to a topology of the target board.

12. The write leveling control method of claim 8, wherein the first range is within about 25% of the DQS reference delay value corresponding to the mounted dual in-line memory module.

13. The write leveling control method of claim 8, wherein the DQS reference delay values are differentiated according to a system-on chip.

14. A memory controller, comprising:
a reference table configured to store data strobe signal (DQS) reference delay values corresponding to types of memory modules;
a clock generator configured to generate a clock signal;
a data strobe signal generator configured to generate a data strobe signal with a delay that is adjusted according to a control signal; and
a control unit configured to control a transfer of write leveling-related signals to a dual in-line memory module mounted on a target board, the write leveling-related signals including the clock signal, a command, an address, and the data strobe signal,
wherein the control unit checks timing skews between the clock signal and data-related signals received from memory devices on the mounted dual in-line memory module,
wherein when a skew failure occurs, the control unit instructs the data strobe signal generator with the control signal to adjust the delay of the data strobe signal sent to a memory device experiencing the skew failure.

15. The memory controller of claim 14, wherein the memory devices are connected on the mounted dual in-line memory module in a fly-by topology.

16. The memory controller of claim 15, wherein whether the skew failure occurs is determined by checking whether a timing skew is outside of a first range based on the the DQS reference delay value corresponding to the mounted dual in-line memory module.

17. The memory controller of claim 16, wherein the delay of the data strobe signal sent to the memory device experiencing the skew failure is adjusted, based on the DQS reference delay value corresponding to the mounted dual in-line memory module and an average offset value of memory devices on the mounted dual in-line memory module that passed a write leveling operation.

18. The memory controller of claim 17, wherein the skew failure occurs when a timing skew exceeds a quarter of a period of the clock signal.

19. The memory controller of claim 14, wherein the DQS reference delay values are differentiated according to a system-on chip, a target board, or a dual in-line memory (DIMM) type.

20. The memory controller of claim 19, wherein the memory controller comprises an algorithm of performing a write leveling operation on a memory module including double data rate type three (DDR3) synchronous dynamic random access memory (SDRAM) devices.

* * * * *